United States Patent
Higashino

(10) Patent No.: US 9,570,426 B2
(45) Date of Patent: Feb. 14, 2017

(54) SEMICONDUCTOR LIGHT-EMITTING DEVICE HAVING MATRIX-ARRANGED LIGHT-EMITTING ELEMENTS AND TRANSPARENT PLATES

(71) Applicant: Stanley Electric Co., Ltd., Tokyo (JP)

(72) Inventor: Jiro Higashino, Kanagawa (JP)

(73) Assignee: STANLEY ELECTRIC CO., LTD., Tokyo (JP)

(*) Notice: Subject to any disclaimer, the term of this patent is extended or adjusted under 35 U.S.C. 154(b) by 0 days.

(21) Appl. No.: 14/947,389

(22) Filed: Nov. 20, 2015

(65) Prior Publication Data
US 2016/0148912 A1    May 26, 2016

(30) Foreign Application Priority Data
Nov. 21, 2014    (JP) .................... 2014-236277

(51) Int. Cl.
| | |
|---|---|
| H01L 25/07 | (2006.01) |
| H01L 25/075 | (2006.01) |
| F21S 8/10 | (2006.01) |
| H01L 33/50 | (2010.01) |
| H01L 33/58 | (2010.01) |

(52) U.S. Cl.
CPC ............ *H01L 25/0753* (2013.01); *F21S 48/00* (2013.01); *F21Y 2105/14* (2016.08); *H01L 33/50* (2013.01); *H01L 33/58* (2013.01); *H01L 2224/73204* (2013.01); *H01L 2924/0002* (2013.01)

(58) Field of Classification Search
CPC ..... H01L 25/0753; H01L 33/52; H01L 33/483
See application file for complete search history.

(56) References Cited

U.S. PATENT DOCUMENTS

2013/0329440 A1* 12/2013 Tsutsumi ................ H01L 24/97
362/465

FOREIGN PATENT DOCUMENTS

| | | |
|---|---|---|
| JP | 2009-134965 A | 6/2009 |
| JP | 2013-54849 A | 3/2013 |
| JP | 2013-54956 A | 3/2013 |
| JP | 2013-187371 A | 9/2013 |

* cited by examiner

*Primary Examiner* — Matthew Reames
(74) *Attorney, Agent, or Firm* — Kenealy Vaidya LLP

(57) ABSTRACT

A semiconductor light-emitting device includes a support body multiple, multiple light-emitting elements arranged in a matrix on the support body, a transparent resin layer provided on the light-emitting elements, multiple transparent plates provided on the transparent resin layer, each of the transparent plates being provided over one of the multiple light-emitting elements, and multiple optical shield layers each provided at one of a first side face of a first one of the transparent plates and a second the face of a second one of the transparent plates opposing the first the face of the first transparent plate.

9 Claims, 12 Drawing Sheets

SEMICONDUCTOR LIGHT-EMITTING DEVICE HAVING MATRIX-ARRANGED LIGHT-EMITTING ELEMENTS AND TRANSPARENT PLATES

This application claims the priority benefit under 35 U.S.C. §119 to Japanese Patent Application No. JP2014-236277 filed on Nov. 21, 2014, which disclosure is hereby incorporated in its entirety by reference.

BACKGROUND

Field

The presently disclosed subject matter relates to a semiconductor light-emitting device having multiple light-emitting elements such as light-emitting diode (LED) elements arranged in a matrix.

Description of the Related Art

Generally, a semiconductor light-emitting device formed by LED elements arranged in a matrix including rows and columns has been used as a vehicle headlamp. In such a semiconductor light-emitting device, luminous intensities of the LED elements are individually controlled in real time to realize an adaptive drive beam (ADB) and an adaptive front-lighting system (AFS) (see: JP2013-54849A & JP2013-54956A).

In an ADB control, when a preceding vehicle including an oncoming vehicle is detected by a radar unit or the like, the luminous intensities of only the LED elements facing toward the preceding vehicle are decreased to decrease the illuminance toward the preceding vehicle while a high-beam mode is maintained. As a result, glare toward the preceding vehicle can be suppressed while the visibility in a high-beam mode can be maintained toward the preceding vehicle.

In an AFS control, when a steering angle read from a steering angle sensor or the like is larger than a predetermined value, the LED elements having high luminous intensities are shifted from a central area of the device to a right side or a left side of the device, to substantially decline the optical axis of the device while the visibility in a high-beam mode is maintained.

FIG. 1A is a plan view illustrating a first prior art semiconductor light-emitting device, as the above-mentioned device and FIG. 1B is a cross-sectional view taken along the line B-B in FIG. 1A. As illustrated in FIGS. 1A and 1B, this semiconductor light-emitting device includes a semiconductor wafer (body) 1 in which blue LED elements $D_{11}$, $D_{12}$, ..., and $D_{33}$ in three rows, three columns are formed. Also, a wavelength-converting layer 3 including a transparent resin layer 31 having yitrium aluminium garnet $Y_2Al_5O_{12}$:$Ce^{3+}$ (YAG) particles for wavelength-converting blue light into yellow light to form white light and barium-titanium-based particulate spacers 32 is formed on the LED elements $D_{11}$, $D_{12}$, ..., and $D_{33}$. Further, a support body 2 is provided to support the semiconductor body 1. In this case, the semiconductor body 1 is wafer-bonded onto the support body 2. This device further includes a transparent plate 4 to make the wavelength-converting layer 3 uniform.

Note that each of the LED elements $D_{11}$, $D_{12}$, ..., and $D_{33}$ is square or rectangular viewed from the top, so that the LED elements $D_{11}$, $D_{12}$, ..., and $D_{33}$ can be in close proximity to each other.

In the first prior art semiconductor light-emitting device of FIGS. 1A and 1B, since there are still relatively large spaces between the LED elements $D_{11}$, $D_{12}$, ..., and $D_{33}$, even when the LED elements $D_{11}$, $D_{12}$, and $D_{33}$ are operated to emit lights $L_{11}$, $L_{12}$, ..., and $L_{33}$, respectively, as illustrated in FIG. 2A, dark regions DR forming a dark grid would be created at the spaces. As a result, as illustrated in FIG. 2B, light emitting regions $ER_{21}$ and $ER_{22}$ of the LED elements $D_{21}$ and $D_{22}$ would be decreased. In this case, the larger the spacing between the LED elements $D_{11}$, $D_{12}$, ..., and $D_{33}$, the larger the dark regions DR.

On the other hand, when the LED elements $D_{11}$, $D_{12}$, ..., $D_{33}$ are closer to each other as illustrated in FIGS. 3A and 3B, the dark regions DR would be reduced in size to increase the light emitting regions $ER_{21}$ and $ER_{22}$. In this case, however, when the LED elements $D_{11}$, $D_{12}$, $D_{13}$, $D_{21}$, $D_{23}$, $D_{31}$, $D_{32}$, and $D_{33}$ except for the LED element $D_{22}$ are operated to emit lights $L_{11}$, $L_{12}$, $L_{13}$, $L_{21}$, $L_{23}$, $L_{31}$, $L_{32}$, and $L_{33}$, leakage lights LL would be leaked into the non-operated LED element $D_{22}$ from its adjacent operated LED elements. Therefore, weak light would be emitted from the non-operated LED element $D_{22}$, so that optical crosstalk would be generated between the non-operated LED element and its adjacent operated LED elements.

Thus, in the first prior art semiconductor light-emitting device of FIGS. 1A and 1B, it is preferable that both of the dark regions DR and the optical crosstalk be as small as possible; however, there is a tradeoff relationship between the dark regions DR and the optical crosstalk.

A second prior art semiconductor light-emitting device includes multiple light-emitting elements each with one wavelength-converting layer thereon on a support body, a grid-shaped optical shield wall for separating the multiple light-emitting elements from each other, multiple transparent plates each provided on one of the multiple light-emitting elements, and a grid-type optical shield frame for separating the transparent plates from each other (see: JP2013-187371A). Thus, both of the dark regions and the optical crosstalk can be decreased by the grid-shaped optical shield frame.

In the above-described second prior art semiconductor light-emitting device, however, since the thickness of the walls of the grid-type optical shield frame is actually very large, i.e., several tens of μm, the dark regions are still very large. Also, the presence of the grid-shaped optical shield frame would increase the manufacturing cost.

A third prior art semiconductor light-emitting device includes multiple light-emitting elements on a support body, a grid-shaped optical shield frame having throughholes corresponding to the light-emitting elements on the support body, and multiple wavelength-converting filter plates each provided in one of the throughholes over one of the light-emitting elements (see: JP2009-134965A). Thus, both of the dark regions and the optical crosstalk can be decreased by the grid-shaped optical shield frame.

In the above-described third prior art semiconductor light-emitting device, however, since the thickness of the walls of the grid-shaped shield frame is actually very large, the dark portions are still very large. Also, the presence of the grid-shaped optical shield frame would increase the manufacturing cost.

SUMMARY

The presently disclosed subject matter seeks to solve one or more of the above-described problems.

According to the presently disclosed subject matter, a semiconductor light-emitting device includes a support body, multiple light-emitting elements arranged in a matrix on the support body, a transparent resin layer provided on the light-emitting elements, multiple transparent plates provided on the transparent resin layer, each of the transparent plates being provided over one of the multiple light-emitting elements, and multiple optical shield layers each provided at one of a first side face of a first one of the transparent plates and a second the face of a second one of the transparent plates opposing the first the face of the first transparent plate.

Thus, according to the presently disclosed subject matter, due to the thin optical shield layers, the dark regions between the light-emitting elements can be remarkably decreased or suppressed, while optical crosstalk between the light-emitting elements is hardly generated regardless of the distance between the light-emitting elements.

BRIEF DESCRIPTION OF THE DRAWINGS

The above and other advantages and features of the presently disclosed subject matter will be more apparent from the following description of certain embodiments, as compared with the prior art, taken in conjunction with the accompanying drawings, wherein.

DETAILED DESCRIPTION OF EXEMPLARY EMBODIMENTS

Figure 4A:
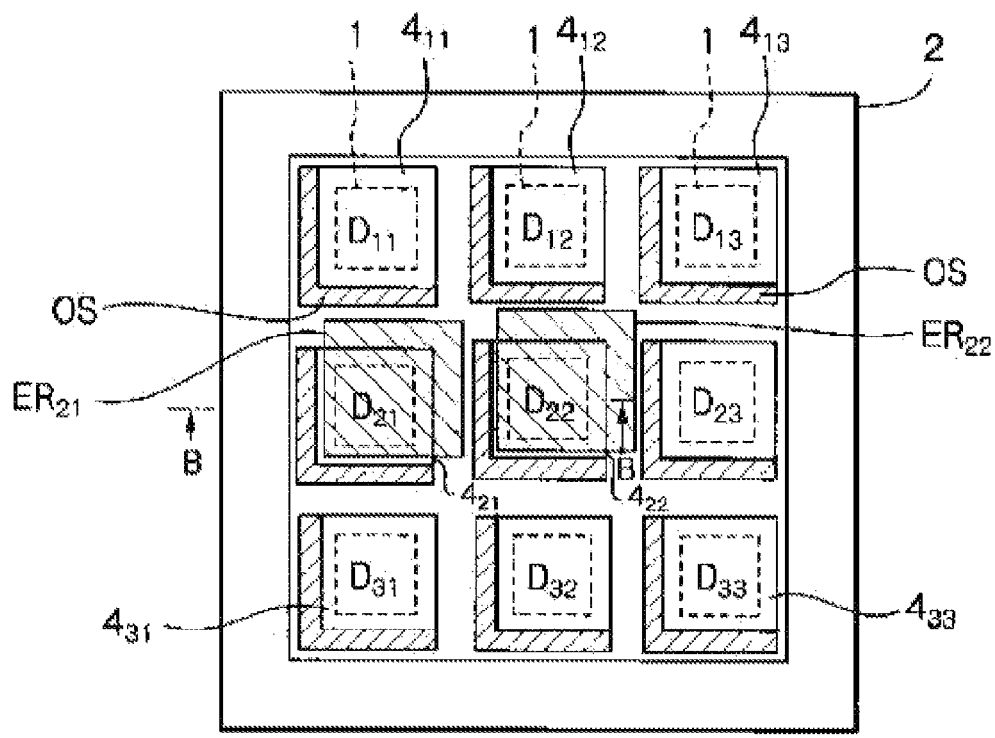
FIG. 4A is a plan view illustrating a first embodiment of the semiconductor light-emitting device according to the presently disclosed subject matter.
Figure 4B:
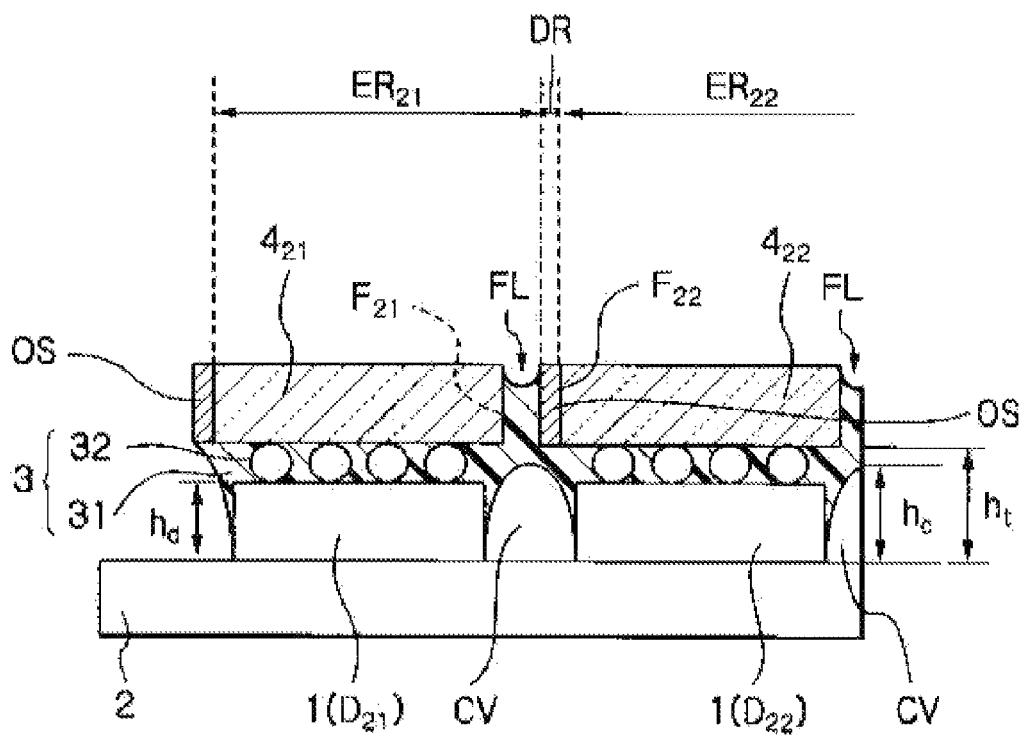
FIG. 4B is a cross-sectional view taken along the line B-B in FIG. 4A.

FIG. 4A illustrates a first embodiment of the semiconductor light-emitting device according to the presently disclosed subject matter, and FIG. 4B is a cross-sectional view taken along the line B-B in FIG. 4A.

Figure 1A:
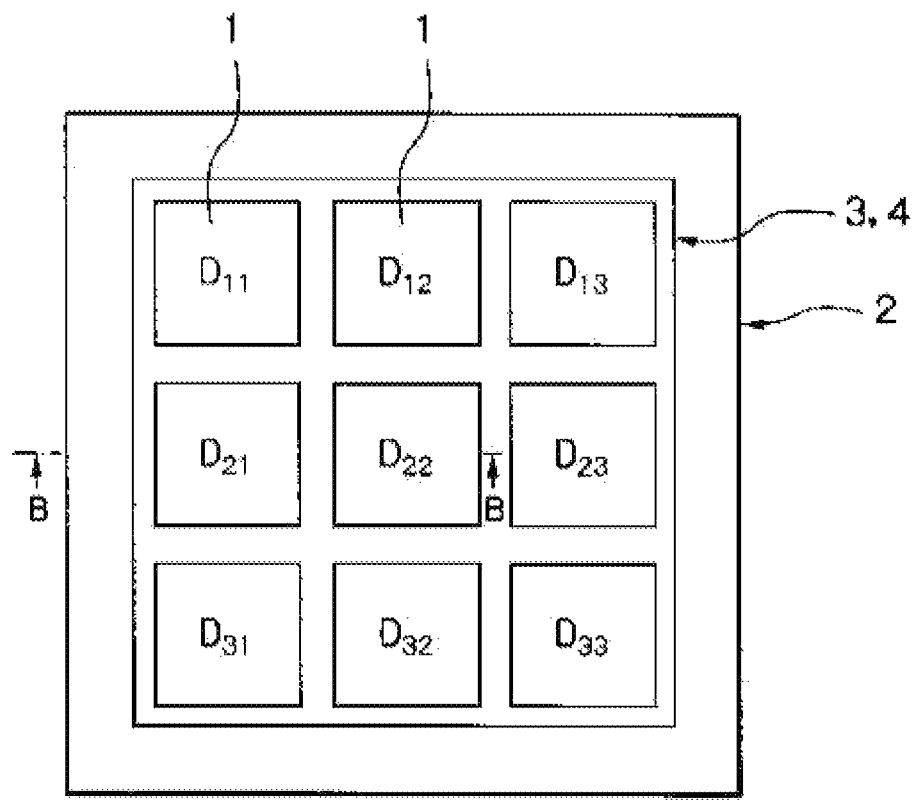
FIG. 1A is a plan view illustrating a first prior art semiconductor light-emitting device.
Figure 1B:
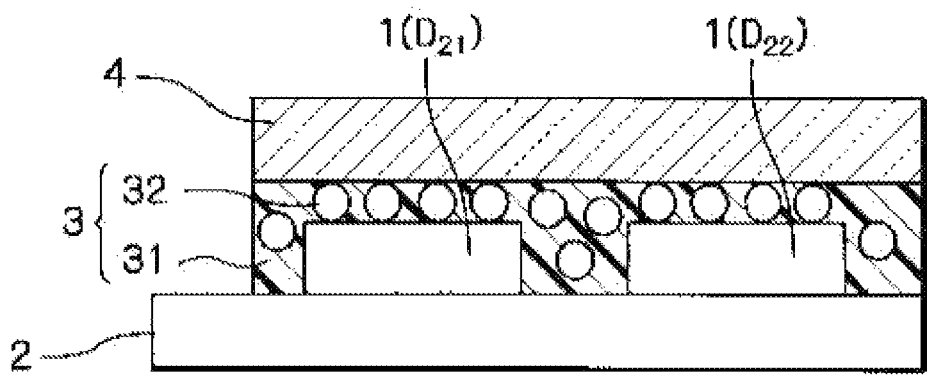
FIG. 1B is a cross-sectional view taken along the line B-B in FIG. 1A.
Figure 2A:
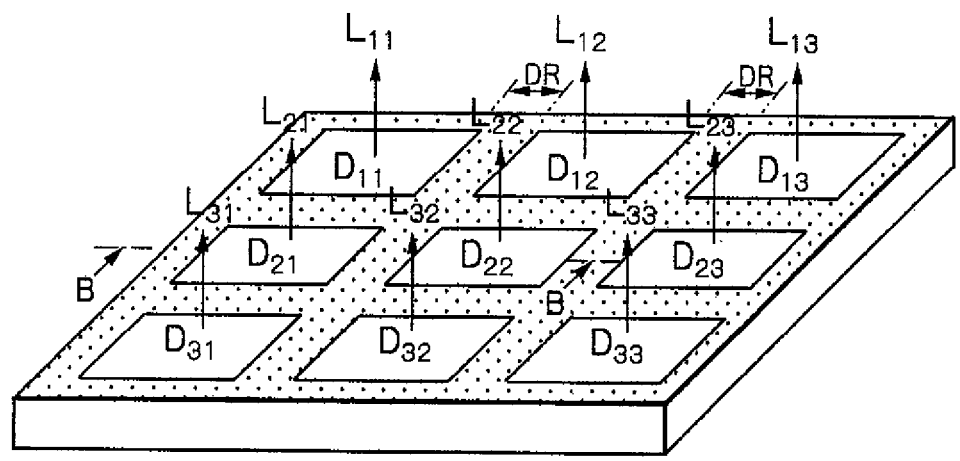
FIG. 2A is a perspective view of the semiconductor light-emitting device of FIG. 1A for explaining the dark regions.
Figure 2B:
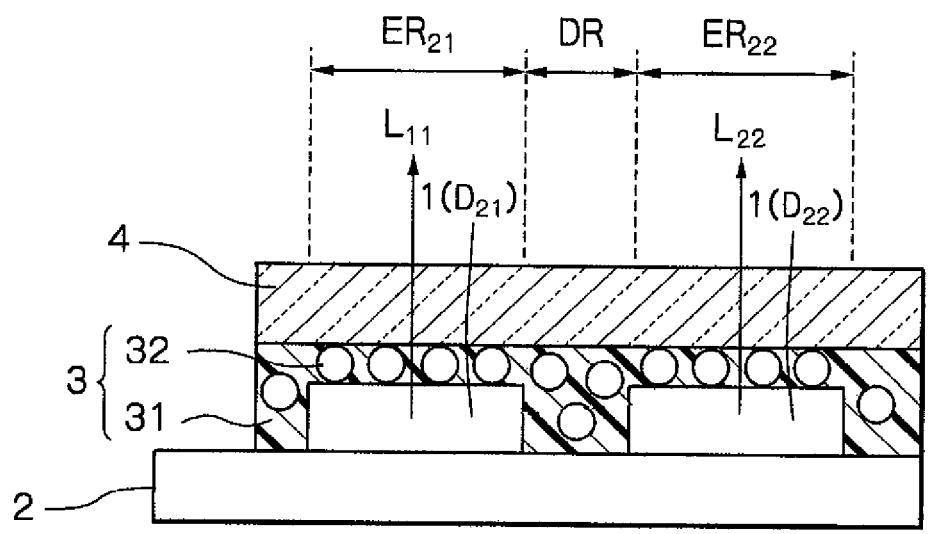
FIG. 2B is a cross-sectional view taken along the line B-B in FIG. 2A.
Figure 3A:
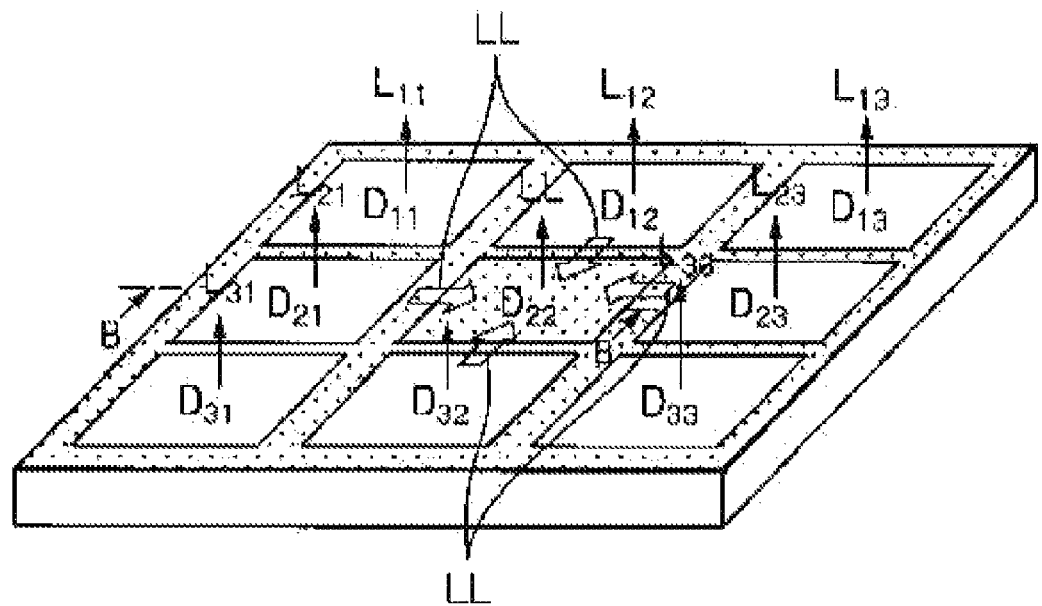
FIG. 3A is a perspective view of the semiconductor light-emitting device of FIG. 1A for explaining the optical crosstalk.
Figure 3B:
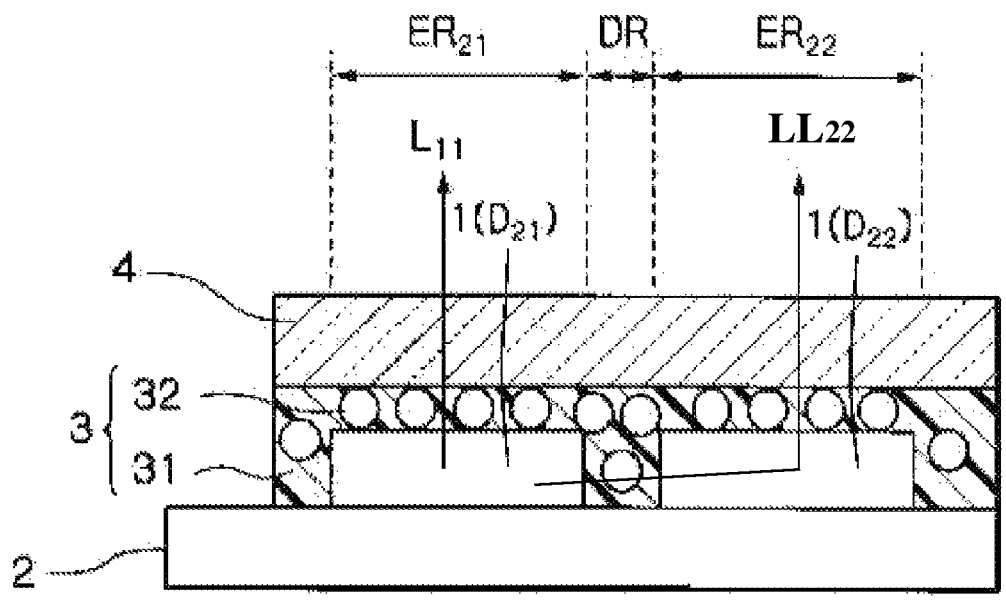
FIG. 3B is a cross-sectional view taken along the line B-B in FIG. 3A.

In FIGS. 4A and 4B, the transparent plate 4 of FIGS. 1A and 1B is replaced by multiple transparent plates $4_{11}$, $4_{12}$, ..., and $4_{33}$ made of a glass material such as sapphire or the like.

The transparent plates $4_{11}$, $4_{12}$, ..., and $4_{33}$ can be individually designed and manufactured to improve the manufacturing yield. That is, each of transparent plates $4_{11}$, $4_{12}$, ..., and $4_{33}$ is determined to be successful or defective. As a result, only the transparent plates determined to be defective would be scrapped. Contrary to this, the transparent plate 4 of FIGS. 1A and 1B is entirely determined to be successful or defective. As a result, if defective, the entire transparent plate 4 would be scrapped.

Each of the transparent plates $4_{11}$, $4_{12}$, ..., and $4_{33}$ is located over the LED elements $D_{11}$, $D_{12}$, ..., and $D_{33}$, respectively. The transparent plates $4_{11}$, $4_{12}$, ..., and $4_{33}$ are a little larger than the LED elements $D_{11}$, $D_{12}$, ..., and $D_{33}$ viewed from the top. The shape of the transparent plates $4_{11}$, $4_{12}$, ..., and $4_{33}$ depends upon that of the LED elements $D_{11}$, $D_{12}$, ..., and $D_{33}$. That is, if the LED elements $D_{11}$, $D_{12}$, ..., and $D_{33}$ are square viewed from the top, the transparent plates $4_{11}$, $4_{12}$, ..., and $4_{33}$ are square viewed from the top. Also, if the LED elements $D_{11}$, $D_{12}$, ..., and $D_{33}$ are rectangular view from the top, the transparent plates $4_{11}$, $4_{12}$, ..., and $4_{33}$ are rectangular viewed from the top.

Also, one optical shield layer OS is formed on one of a side face of one transparent plate and a side face of its adjacent transparent plate opposing the side face of the one transparent plate. For example, as illustrated in FIG. 4B, the LED element $D_{21}$ is adjacent to the LED element $D_{22}$, and a side face $F_{21}$ of the transparent plate $4_{21}$ opposes a side face $F_{22}$ of the transparent plate $4_{22}$. In this case, one optical shield layer OS is formed on either the side face $F_{21}$ of the transparent plate $4_{21}$ or the side face $F_{22}$ of the transparent plate $4_{22}$.

The optical shield layer OS is made of metal such as Ag, Pt, Al, Rh, Ti or carbon black for shielding the transparent plates from visible light of their adjacent LED elements. In this case, the metal is reflective rather absorptive, and carbon black is absorptive rather reflective. That is, the optical shield layer OS is reflective and/or absorptive; however, the optical shield layer OS is not completely reflective or not completely absorptive. As a result, the light emitting regions $ER_{11}$, $ER_{12}$, ..., and $ER_{33}$ are partitioned by the optical shield layers OS, not by the transparent plates $4_{11}$, $4_{12}$, ... and $4_{33}$.

Note that reflective materials rather than absorptive materials are preferable for the optical shield layer OS, in order to exhibit a high light extraction efficiency and avoid the generation of heat.

If the optical shield layers OS are completely reflective, since lights that arrive from the LED element $D_{21}$ to the optical shield layers OS are totally reflected by the optical shield layers OS, these lights would be emitted from the light emitting region $ER_{21}$. Also, since lights that arrive from the LED element $D_{22}$ to the optical shield layers OS are totally reflected by the optical shield layer OS, these lights would be emitted from the light emitting regions $ER_{22}$. Therefore, the dark region DR between the LED element $D_{21}$ and $D_{22}$ determined by the optical shield layers OS is decreased, so that the light emitting regions $ER_{21}$ and $ER_{22}$ of the LED elements $D_{21}$ and $D_{22}$ are increased. Also, the optical crosstalk between the light emitting regions $ER_{21}$ and $ER_{22}$ can be suppressed regardless of the distance between the LED elements $D_{21}$ and $D_{22}$.

On the other hand, if the optical shield layers OS are completely absorptive, lights that arrive from the LED element $D_{21}$ to the optical shield layers OS are completely absorbed by the optical shield layers OS, and also, lights that arrive from the LED element $D_{22}$ to the optical shield layers OS are completely absorbed by the optical shield layers OS. Therefore, although the dark region DR between the LED elements $D_{21}$ and $D_{22}$ is not decreased, so that the light emitting regions $ER_{21}$ and $ER_{22}$ of the LED elements $D_{21}$ and $D_{22}$ are not increased, optical crosstalk between the light emitting regions $ER_{21}$ and $ER_{22}$ is hardly generated.

Also, in order to increase the light emitting regions $ER_{21}$ and $ER_{22}$, the LED elements $D_{21}$ and $D_{22}$ can be closer to each other. In this case, the dark region DR between the LED elements $D_{21}$, and $D_{22}$ determined by the spacing therebetween can be decreased or suppressed to increase the light emitting regions $ER_{21}$ and $ER_{22}$, while optical crosstalk between the light emitting regions $ER_{21}$ and $ER_{22}$ is hardly generated. However, the light emitting regions $ER_{21}$ and $ER_{22}$ are partitioned by the transparent plates $4_{21}$ and $4_{22}$, particularly, their optical shield layers OS, not by the LED elements $D_{21}$ and $D_{22}$. In this case, the thickness of the optical shield layers OS is very thin as will be explained later. Therefore, the spacing between the transparent plates $4_{21}$ and $4_{22}$ can be easily reduced to increase the light emitting regions $ER_{21}$ and $ER_{22}$, thus making the entire extracted light uniform.

Further, in FIGS. 4A and 4B, the optical shield layers OS are arranged in a line; however, the optical shield layers OS can be arranged in a staggered manner.

Thus, in the semiconductor light-emitting device of FIGS. 4A and 4B, the dark regions DR can be decreased or suppressed, while optical crosstalk between the LED elements is hardly generated.

In FIGS. 4A and 4B, cavities CV are created in the wavelength-converting layer 3 between the LED elements $D_{11}, D_{12}, \ldots,$ and $D_{33}$ on the support body 2. Note that air is filled in the cavities CV; however, if sealed nitrogen gas is filled in the cavities CV, the deterioration of the wavelength-converting layer 3 can be suppressed. In this case, a height $h_c$ of the cavities CV is larger than a height $h_d$ of the LED elements $D_{11}, D_{21}, \ldots,$ and $D_{33}$, i.e., $$h_c > h_d$$

Also, the cross section of the cavities CV is convex or fan-shaped to surround all the sides of the LED elements $D_{11}, D_{12}, \ldots,$ and $D_{33}$. Therefore, each of the cavities CV serves as an optical shield. As a result, lights that arrive from the LED elements $D_{11}, D_{12}, \ldots,$ and $D_{33}$ to the cavities CV are reflected and/or absorbed by the cavities CV, so that the optical crosstalk between the light emitting regions $ER_{21}$ and $ER_{22}$ can further be suppressed regardless of the distance between the LED elements $D_{21}$ and $D_{22}$.

Since lights from the LED elements $D_{21}$ and $D_{22}$ are leaked through the wavelength-converting layer 3 between the cavities CV and the optical shield layers OS to increase the crosstalk, the height $h_e$ of the cavities CV is preferably close to the height 11, of the lower surface of the transparent plates $4_{11}, 4_{12}, \ldots,$ and $4_{33}$. That is, the smaller the difference between the height $h_c$ and the height h, the smaller the crosstalk between the LED elements $D_{11}, D_{12}, \ldots,$ and $D_{33}$. Particularly, when $h_c \geq h_t$, so that the cavities CV are immediately adjacent to the optical shield layers OS, the crosstalk between the LED elements $D_{11}, D_{12}, \ldots,$ and $D_{33}$ can completely be suppressed.

The wavelength-converting layer 3 is present uniformly between the LED elements $D_{11}, D_{12}, \ldots,$ and $D_{33}$ and the transparent plates $4_{11}, 4_{12}, \ldots,$ and $4_{33}$. Additionally, as indicated by FL in FIG. 4B, the wavelength-converting layer 3 is filled between the transparent plates $4_{11}, 4_{12}, \ldots,$ and $4_{33}$ while a concave recess is generated in the top surface of the wavelength-converting layer 3. As a result, the light extraction efficiency can be substantially uniform within the light emitting regions $ER_{21}$ and $ER_{22}$.

A method for manufacturing the semiconductor light-emitting device of FIGS. 4A and 4B will now be explained with reference to FIGS. 5A, 5B, 6, 7, 8A and 8B.

Figure 5A:
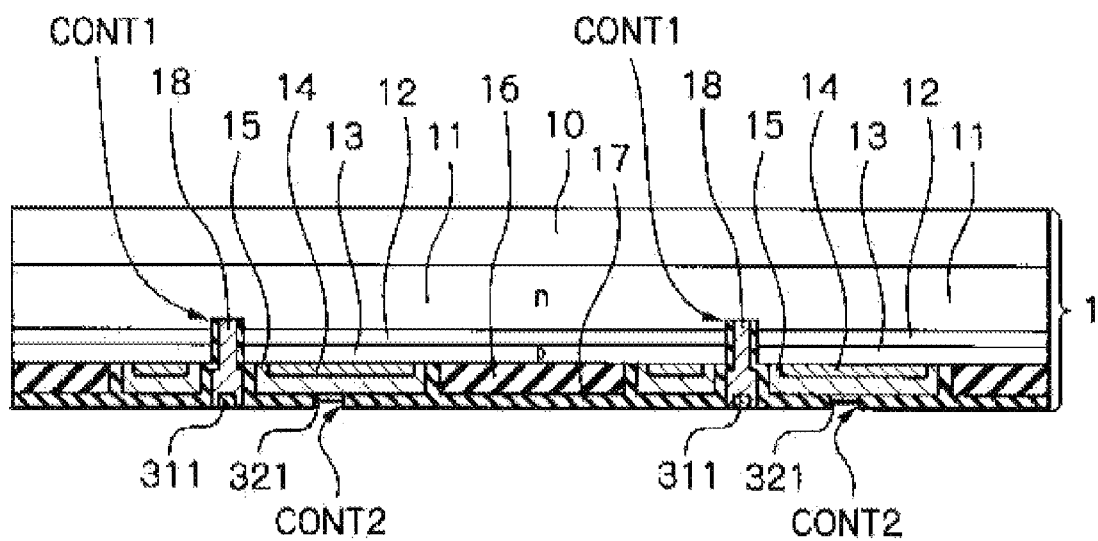
FIGS. 5A, 5B, 6, 7, 8A, 8B and 8C are cross-sectional views for explaining a method for manufacturing the semiconductor light-emitting device of FIGS. 4A and 4B.

First, referring to FIG. 5A, a growing sapphire substrate 10 is prepared. Then, an n-type AlInGaN layer 11, an active AlInGaN layer 12 and a p-type AlInGaN layer 13 are sequentially and epitaxially grown on the growing sapphire substrate 10 by a metal organic chemical vapor deposition (MOCVD) process. The n-type AlInGaN layer 11, the active AlInGaN layer 12 and the p-type AlInGaN layer 13 are represented by $Al_xIn_yGa_{1-x-y}N$ ($0 \leq x \leq 1$, $0 \leq y \leq 1$). In this case, the active AlInGaN layer 12 can be of a multiple quantum well (MQW) structure, of a single quantum well (SQW) structure or of a single layer.

Next, a reflective layer 14 and a cap layer 15 are formed on the p-type AlInGaN layer 13 by a sputtering process or the like, and are patterned by a photolithography/etching process. The reflective layer 14 is made of metal such as Ag, Pt, Ni, Al, Pd or their alloy having good ohmic contact characteristics with the p-type AlInGaN layer 13, and the cap layer 15 is made of refractory metal such as Ti, Pd, Mo, Ru or Ir or noble metal such as Pt or Au. The cap layer 15 is hardly migrated to avoid the migration of the reflective layer 14. The reflective layer 14 and the cap layer 15 serve as a p-side electrode. Note that a metal oxide layer made of indium tin oxide (ITO) or indium zinc oxide (IZO) can be inserted between the p-type AlInGaN layer 13 and the reflective layer 14 to enhance the reflectivity.

Next, an etching adjustment layer 16 is formed by a sputtering process or the like, and is patterned by a photolithography/etching process. The etching adjustment layer 16 is made of insulating material such as silicon dioxide or silicon nitride to isolate the LED elements $D_{21}$ and $D_{22}$ from each other. The etching adjustment layer 16 serves as an etching stopper as well as a protecting layer for wiring layers of the support body 2.

Next, a contact hole CONT1 is perforated in the p-type AlInGaN layer 13 and the active AlInGaN layer 12 to reach the n-type AlInGaN layer 11.

Next, an insulating layer 17 is formed on the entire surface including the sidewall of the contact hole CONT1 by a CVD process or the like. Then, a photolithography/etching process is performed upon the insulating layer 17 to expose the bottom of the contact hole CONT1 and form a contact hole CONT2 in the insulating layer 17 opposing the cap layer 15. The insulating layer 17 is made of silicon dioxide or silicon nitride. In this case, the contact hole CONT1 reaches the n-type AlInGaN layer 11 before the formation of the insulating layer 17.

Next, an n-side electrode 18 is formed in the contact hole CONT1 by a sputtering process or the like and a photolithography/etching process. The n-side electrode 18 is made of metal such as Ti, Al, Pt or Au having good ohmic contact characteristics with the n-type AlInGaN layer 11.

Next, an adhesive layer 311 including Au on its upper surface portion is formed on the n-side electrode 18. The adhesive layer 311 is used for the bonding layer 31 of FIG. 6. Also, an adhesive layer 321 including Au on its upper surface portion is formed on the cap layer 15. The adhesive layer 321 is used for the bonding layer 32 of FIG. 6.

Figure 5B:
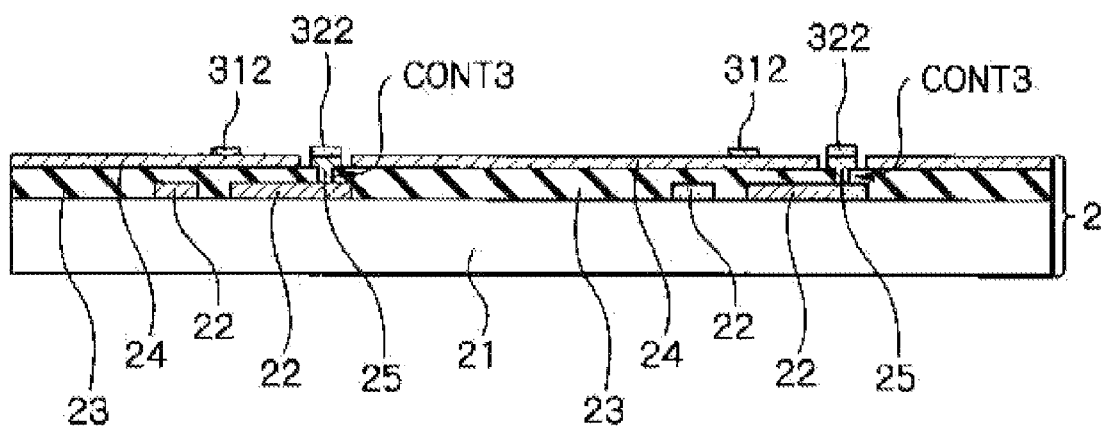

On the other hand, referring to FIG. 5B, a support substrate 21 is prepared. The support substrate 21 is made of heat dissipating material such as Si, AlN, Mo, W or CuW. Then, p-side wiring layers 22 are formed by a sputtering process or the like and a photolithography/etching process on the support substrate 21.

Next, an insulating layer 23 made of silicon dioxide or the like is formed by a CVD process on the p-side wiring layers 22.

Next, an n-side wiring layer 24 is formed by a sputtering process or the like and a photolithography/etching process on the insulating layer 23.

Next, a contact hole CONT3 is perforated by a photolithography/etching process in the insulating layer 23 to reach the p-side wiring layers 22.

Next, a p-side electrode 25 is formed by a sputtering process and the like and a photolithography/etching process in the contact hole CONT3 of the insulating layer 23.

Next, an adhesive layer 312 including Au on its upper surface portion is formed on the n-side wiring layer 24. The adhesive layer 312 is used for the bonding layer 31 of FIG. 6. Also, an adhesive layer 322 including Au on its upper surface portion is formed on the p-side electrode 25. The adhesive layer 322 is used for the bonding layer 32 of FIG. 6.

Figure 6:
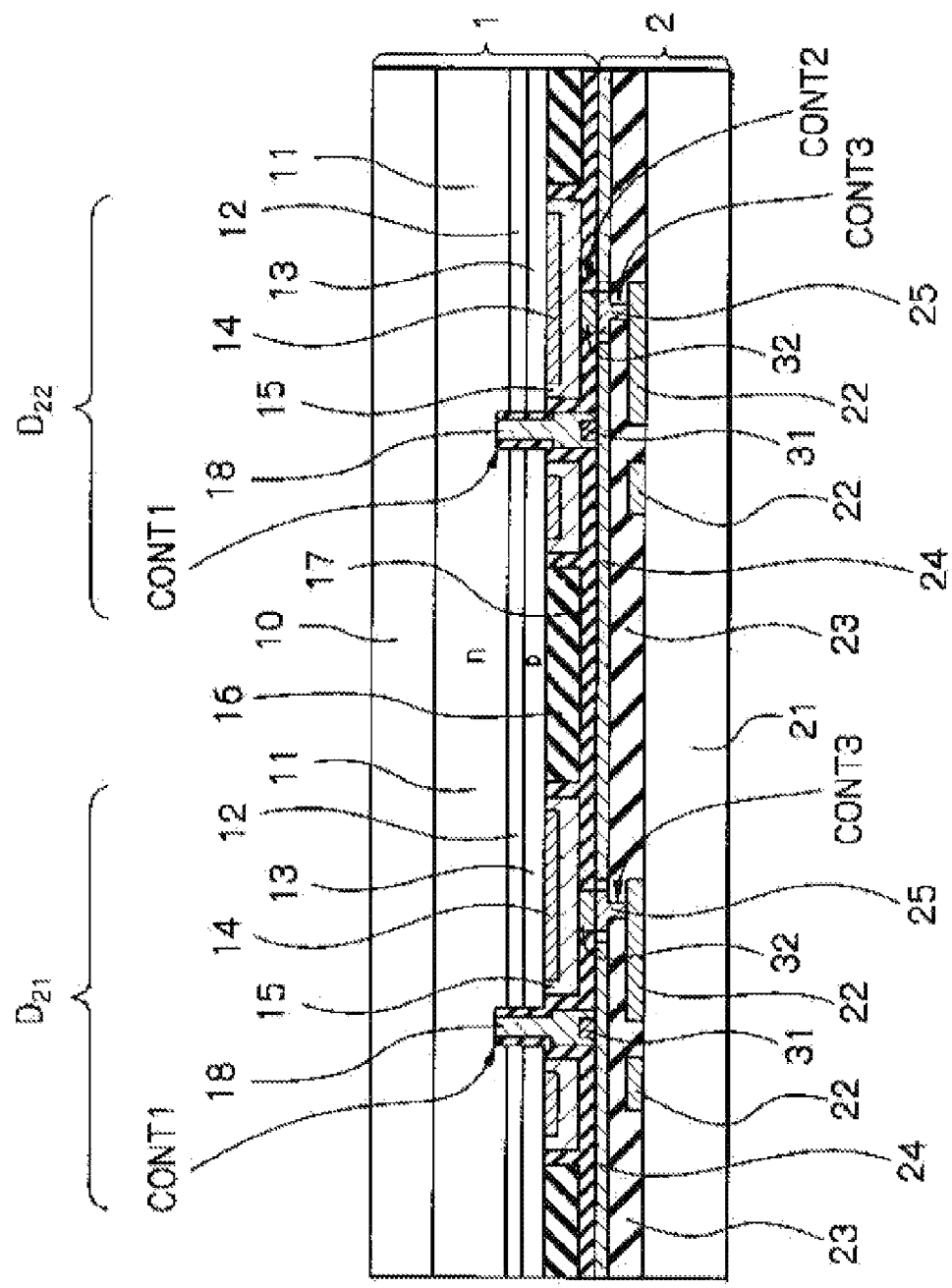

Next, referring to FIG. 6, the semiconductor body 1 of FIG. 5A is bonded by a thermal pressurizing process onto the support body 2 of FIG. 5B. As a result, the adhesive layers 311 and 312 are combined into a bonding layer 31, and the adhesive layers 321 and 322 are combined into a bonding layer 32. In this case, if a material such as Au at the upper surface portion of the adhesive layer 311 is different from a material such as Sn of the adhesive layer 312, the bonding layer 31 is an AuSn eutectic alloy layer. Similarly, if a material such as Au at the upper surface portion of the adhesive layer 321 is different from a material such as Sn of the adhesive layer 322, the bonding layer 32 is an AuSn eutectic alloy layer. The n-side electrode 18 is bonded to the n-side wiring layer 24 by the bonding layer 31, and the cap layer 15 coupled to the p-type AlInGaN layer 13 is bonded to the p-side electrode 25 by the bonding layer 32.

Next, the growing sapphire substrate 10 is removed by a wet etching process or the like.

As occasion demands, a sand blast process is performed upon the n-type AlInGaN layer 11, so that the n-type AlInGaN layer 11 can have a protruded light extracting surface to suppress the total internal reflection component and the Fresnel component, thus improving the light extracting efficiency.

Figure 7:
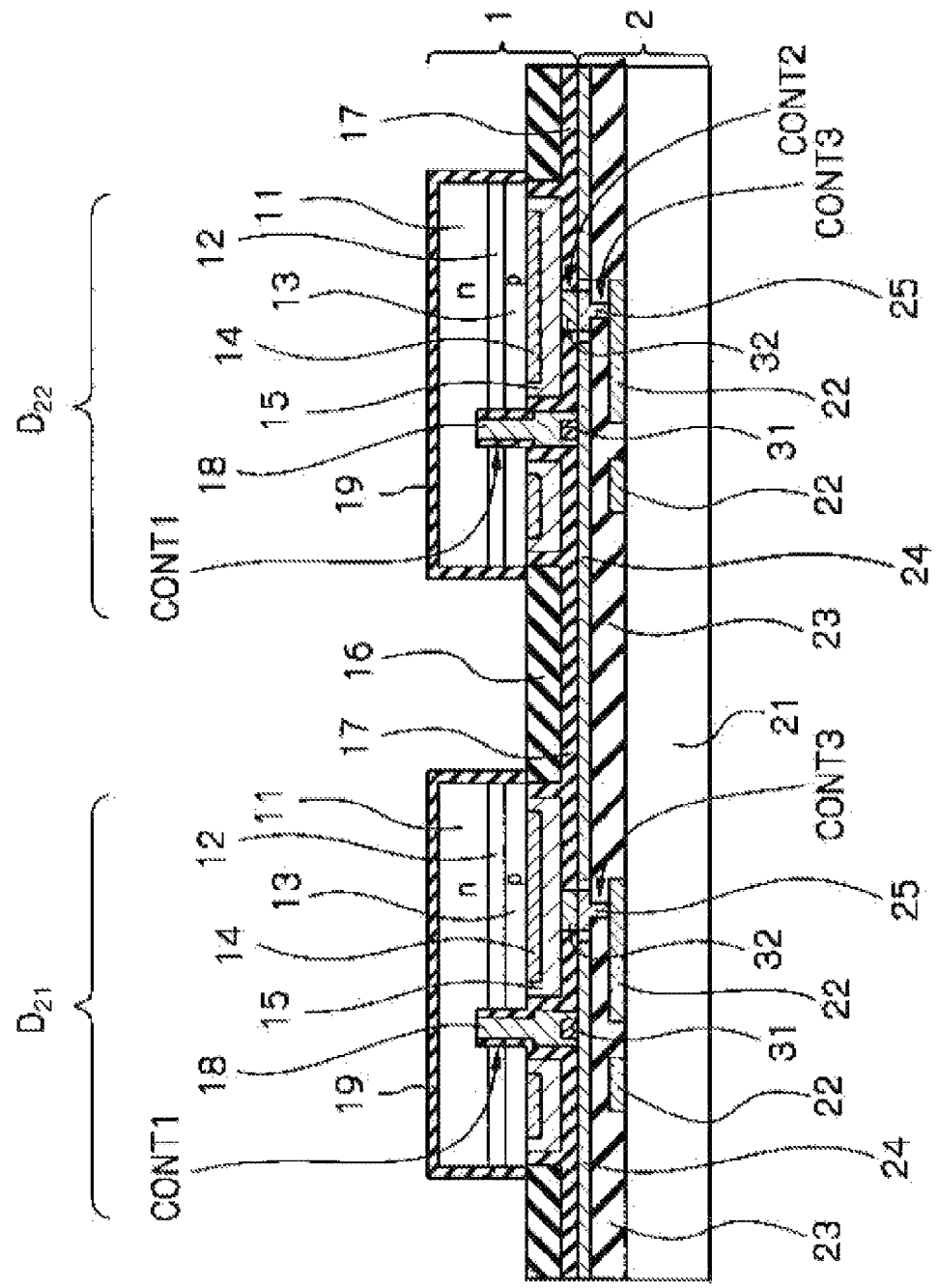

Next, referring to FIG. 7, the n-type AlInGaN layer 11, the active AlInGaN layer 12 and the p-type AlInGaN layer 13 are etched by a reactive ion etching (RIE) process using the etching adjustment layer 16 as an etching stopper.

Figure 8A:
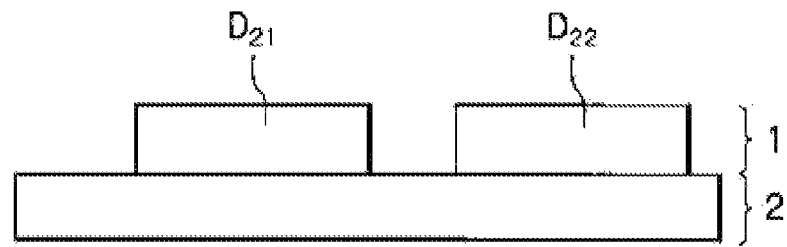

The structure of FIG. 7 is simplified into a structure as illustrated in FIG. 8A.

Figure 8B:
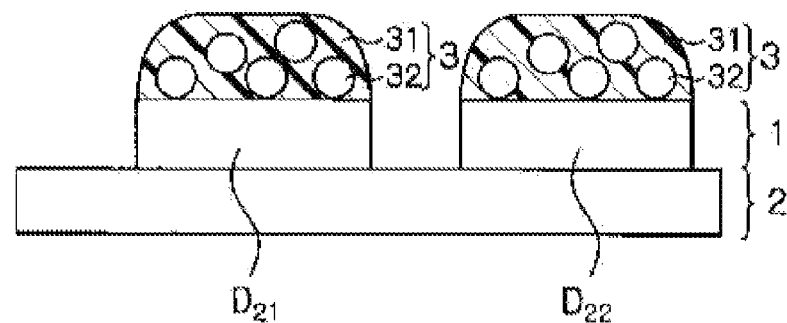

Next, referring to FIG. 8B, a wavelength-converting layer (paste) 3 including a transparent resin layer 31 and YAG particles and spacers 32 is coated on only the LED elements $D_{11}, D_{12}, \ldots,$ and $D_{33}$ by a dispenser (not shown). In this case, the transparent resin layer (paste) 31 is made of epoxy resin, silicone resin, urethane resin, or a hybrid resin thereof. Instead of the yellow phosphor particles such as YAG particles, red phosphor particles such as $CaAlSiN_3:Eu^{2+}$ can be included in the wavelength-converting layer 3, as occasion demands.

Figure 8C:
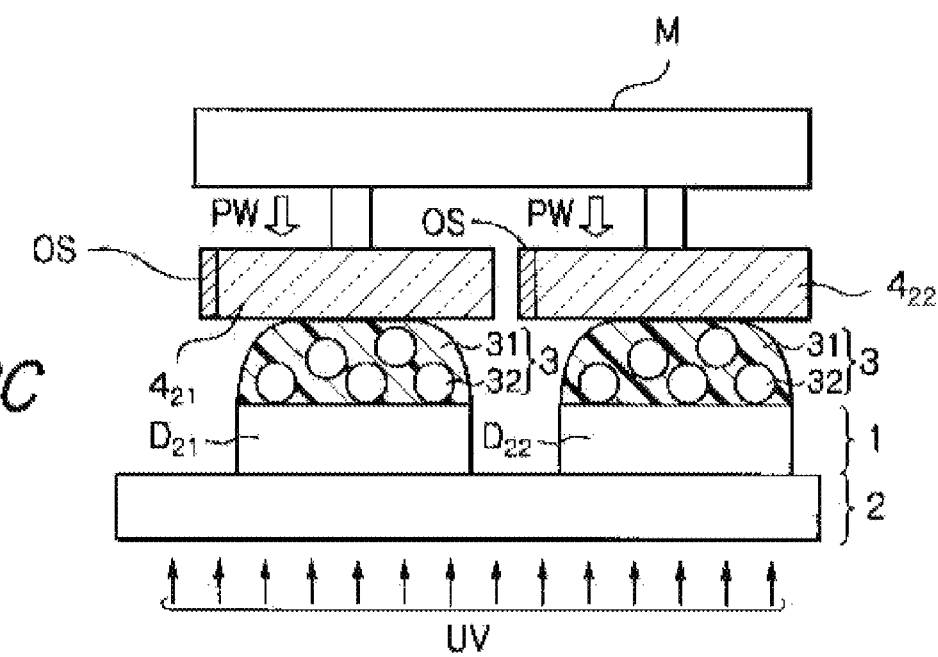

Next, referring to FIG. 8C, transparent plates $4_{12}, \ldots,$ and $4_{33}$ having optical shield layers OS formed on their side faces are prepared. That is, the optical shield layers OS made of metal such as Ag, Pt, Al, Rh or Ti or carbon black are deposited on the side faces of the transparent plates $4_{12},$ and $4_{33}$ in advance by an evaporating process or a plating process. In this case, the optical shield layers OS can be very thin, i.e., 100 nm. Then, the transparent plates $4_{11},$ $4_{12}, \ldots,$ and $4_{33}$ are sucked by a mounter M using vacuum and are pulled onto the wavelength-converting layer 3. Then, a pressure PW is applied by the mounter M to the transparent plates $4_{11}, 4_{12}, \ldots,$ and $4_{33}$ while the support body 2 is being heated by a heater or irradiated by ultraviolet rays UV. As a result, the wavelength-converting layer 3 extends over the top faces of the LED elements $D_{11},$ $D_{12}, \ldots,$ and $D_{33}$. Additionally, the wavelength-converting layer 3 are leaked onto the sidewalls of the LED elements $D_{11}, D_{12}, \ldots,$ and $D_{33}$ to form cavities CV therebetween. Further, the wavelength-converting layer 3 penetrates between the transparent plates $4_{11}, 4_{12}, \ldots,$ and $4_{33}$ due to the capillary action, so that a concave recess indicated by FL in FIG. 4B is generated on the top surface of the wavelength-converting layer (paste) 3 between the transparent plates $4_{11},$ $4_{12}, \ldots,$ and $4_{33}$. Then, the support body 2 is cooled, so that the wavelength-converting layer (paste) 3 is hardened.

As occasion demands, a sand blast process is performed upon the transparent plates $4_{11}, 4_{12}, \ldots,$ and $4_{33}$ and the top surface of the wavelength-converting layer 3 to suppress the total internal reflection component and the Fresnel component, thus improving the light extracting efficiency.

Thus, the semiconductor light emitting device of FIGS. 4A and 4B is completed.

Finally, the support body 2 is mounted on a printed circuit board (not shown), and necessary wires are bonded between the semiconductor light-emitting device and the printed circuit board. As occasion demands, the entirety of the semiconductor light-emitting device is resin-molded (not shown).

The LED elements $D_{11}, D_{12}, \ldots,$ and $D_{33}$ are provided at intersections between the p-side wiring layers 22 and the n-side wiring layers 24 which are isolated by the insulating layer 23. Therefore, the LED elements $D_{11}, D_{12}, \ldots,$ and $D_{33}$ are operated individually in real time by supplying voltages to the p-side wiring layers 22 and the n-side wiring layer 24.

In FIG. 4A, the optical shield layers OS are provided at the outermost side faces of the LED elements to obtain a clearly illuminated image; however, such optical shield layers can be omitted.

Figure 9:
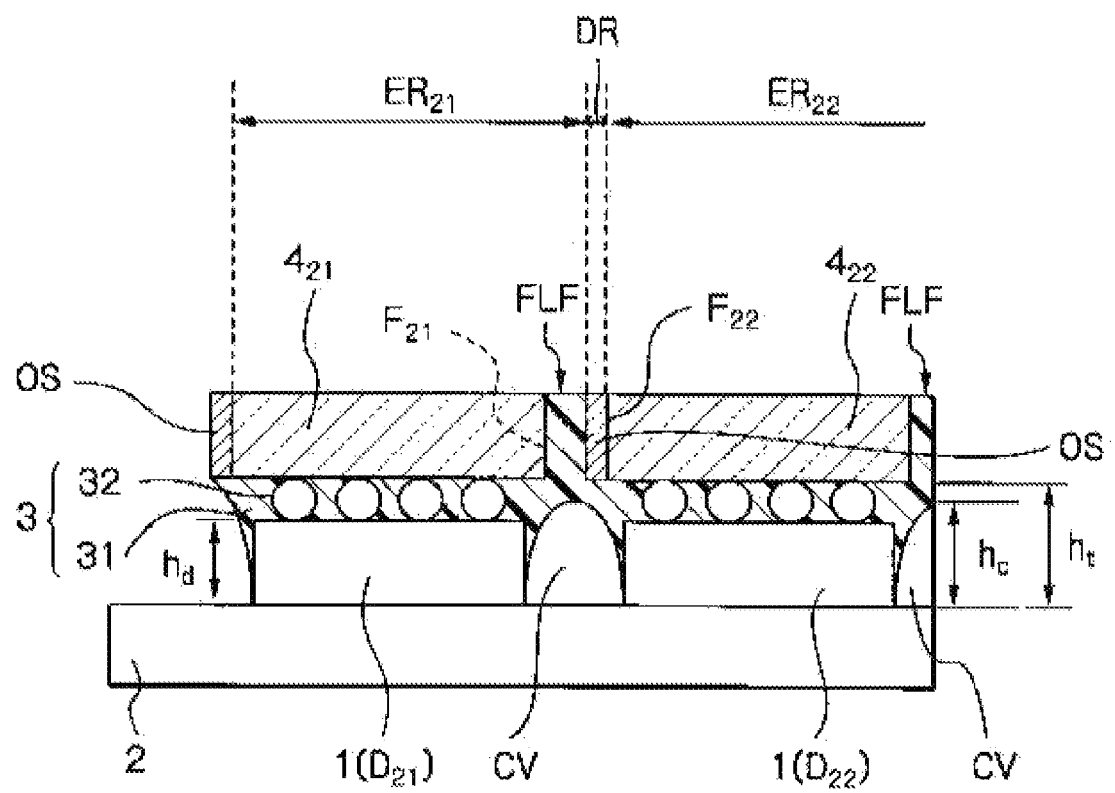
FIG. 9 is a cross-sectional view illustrating a modification of the semiconductor light-emitting device of FIG. 4B.

In FIG. 9, which illustrates a modification of the light-emitting device of FIG. 4B, the top surface FLF of the wavelength-converting layer 3 between the transparent plates $4_{11}, 4_{12}, \ldots,$ and $4_{33}$ is the same as that of the transparent plates $4_{11}, 4_{12}, \ldots,$ and $4_{33}$, thus making the light extraction efficiency more uniform over the entire surface.

Figure 10A:
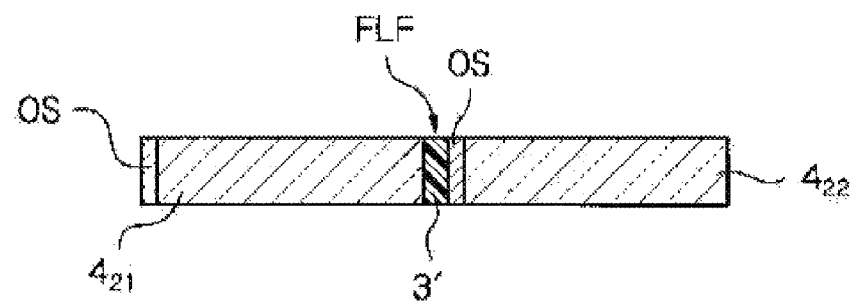
FIGS. 10A and 10B are cross-sectional views for explaining a method for manufacturing the semiconductor light-emitting device of FIG. 9.
Figure 10B:
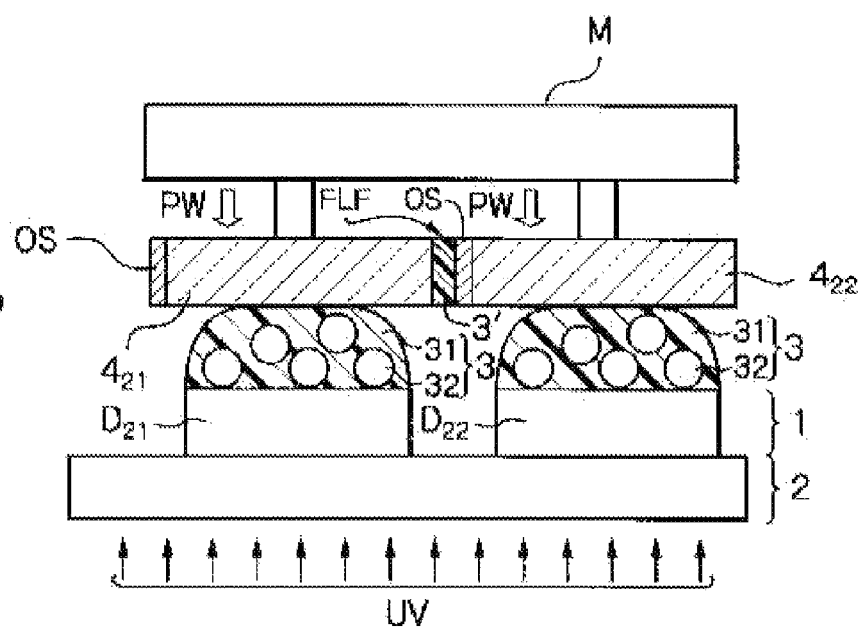

The flat top surface FLF of the wavelength-converting layer 3 can be realized by adding some wavelength-converting layer (paste) to the recess indicated by FL in FIG. 4B. Then, the added wavelength-converting layer 3 is flattened. Or, an excessive amount of paste for the wavelength-converting layer 3 is coated on the LED elements $D_{11},$ $D_{12}, \ldots,$ and $D_{33}$, to create convex wavelength-converting layers 3 between the transparent plates $4_{11}, 4_{12}, \ldots,$ and $4_{33}$. Then, the convex wavelength-converting layers 3 are flattened. Otherwise, as illustrated in FIG. 10A, the transparent plates $4_{11}, 4_{12}, \ldots,$ and $4_{33}$ along with the optical shield layers OS are coupled by wavelength-converting layers (paste) 3', so that the transparent plates $4_{11}, 4_{12}, \ldots,$ and $4_{33}$ are coupled by the flattened wavelength-converting layers 3' as indicated by FLF in FIG. 10A. Then, as illustrated in FIG. 10B, in the same way as in FIG. 8C, the transparent plates $4_{11}, 4_{12}, \ldots,$ and $4_{33}$ are mounted on the LED elements $D_{11},$ $D_{12}, \ldots,$ and $D_{33}$ by the mounter M.

Figure 11:
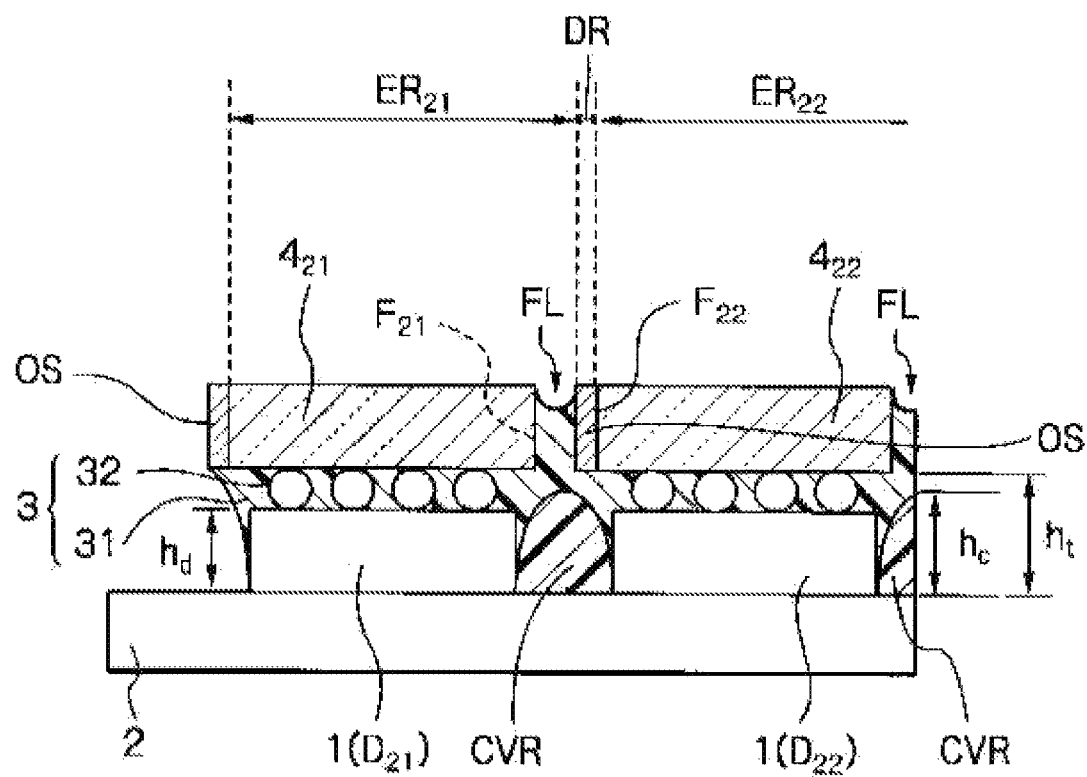
FIG. 11 is a cross-sectional view illustrating a second embodiment of the semiconductor light-emitting device according to the presently disclosed subject matter.

In FIG. 11, which illustrates a second embodiment of the semiconductor light-emitting device according to the presently disclosed subject matter, optical shield resin members CVR, that are reflective and/or absorptive, are filled in the cavities CV of FIG. 4B. The optical shield resin members CVR are made of epoxy resin paste or silicone resin paste including titanium oxide niobium oxide, thallium oxide, zirconium oxide, barium sulfate, aluminum oxide, silicon oxide or zinc oxide. Therefore, each of the optical shield resin members CVR serves as an optical shield in the same way as the cavities CV; however, the optical shield effect of the optical shield resin members CVR would be larger than that of the cavities CV.

The method for manufacturing the semiconductor light-emitting device of FIG. 11 is about the same as the method for manufacturing the semiconductor light-emitting device of FIGS. 4A and 4B, except for the following. After the formation of the cavities CV as illustrated in FIG. 4B, a coating process is performed upon the cavities CV. That is, the cavities CV have very small cross sections and are coupled to each other. Therefore, the above-mentioned paste would easily penetrate through the cavities CV from their sides due to the capillary action, so that fan-shaped cross-sectional optical shield resin members CVR are formed between the LED elements $D_{11}, D_{12}, \ldots,$ and $D_{33}$.

Figure 12:
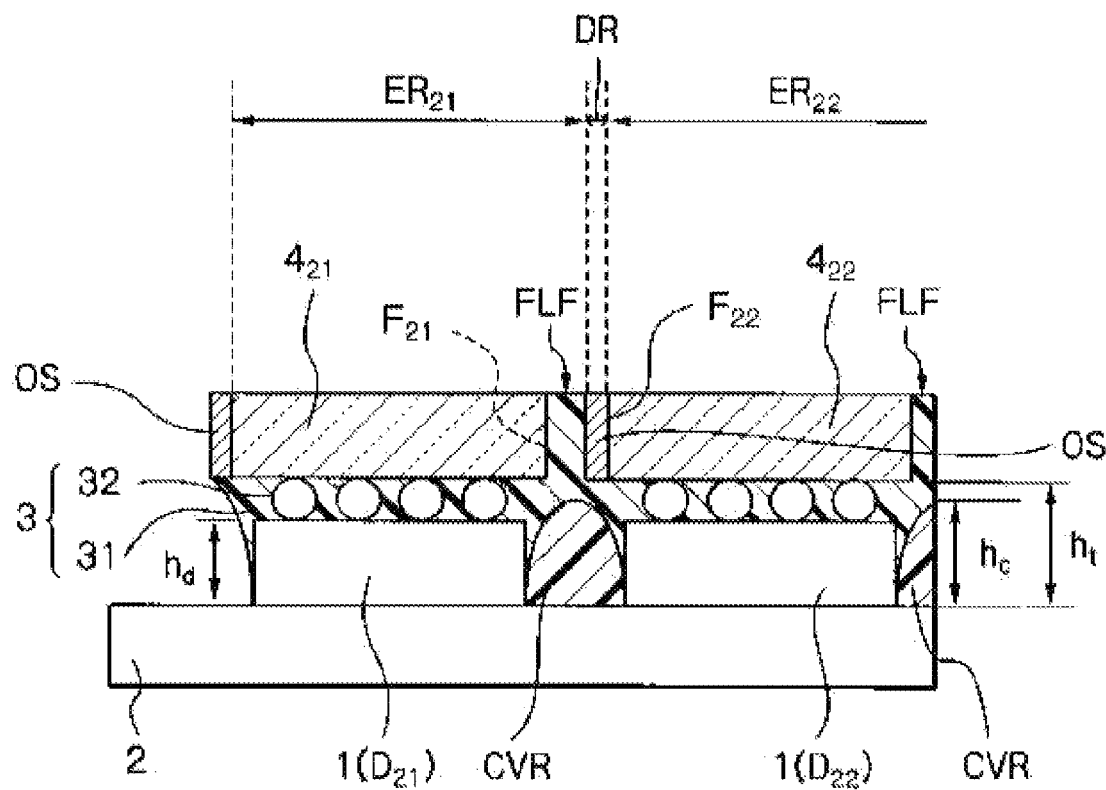
FIG. 12 is a cross-sectional view illustrating a modification of the semiconductor light-emitting device of FIG. 11.

In FIG. 12, similar to FIG. 9, which illustrates a modification of the light-emitting device of FIG. 11, the top surface FLF of the wavelength-converting layer 3 between the transparent plates $4_{11}, 4_{12}, \ldots,$ and $4_{33}$ is the same as that of the transparent plates $4_{11}, 4_{12}, \ldots,$ and $4_{33}$, thus making the light extraction efficiency more uniform over the entire surface.

In the above-described embodiments, phosphor particles such as YAG particles are included in the wavelength-converting layer 3; however, such phosphor particles can be included in the transparent plates $4_{11}, 4_{12}, \ldots,$ and $4_{33}$. In this case, the wavelength-converting layer 3 is replaced by a transparent resin layer made of epoxy resin, silicone resin, urethane resin, or their hybrid resin without phosphor particles.

Also, in the above-described embodiments, the cavities CV or the optical shield resin members CVR completely occupy the regions between the LED elements $D_{11}, D_{12}, \ldots,$ and $D_{33}$, i.e., there is no wavelength-converting layer in the regions between the LED elements $D_{11}, D_{12}, \ldots,$ and $D_{33}$; however, parts of the wavelength-converting layer 3 can be formed in the regions between the LED elements $D_{11}, D_{12}, \ldots,$ and $D_{33}$.

Further, the LED elements $D_{11}, D_{12}, \ldots,$ and $D_{33}$ can be of a flip-chip type.

Furthermore, in the above-described embodiments, the LED elements are square or rectangular viewed from the top; however, the LED elements can be triangular or hexagonal viewed from the top, so that the LED elements can be in close proximity to each other.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. A semiconductor light-emitting device comprising:
   a support body;
   multiple light-emitting elements arranged in a matrix on said support body;
   a transparent resin layer provided on said light-emitting elements;
   multiple transparent plates provided on said transparent resin layer, each of said transparent plates being provided over one of said multiple light-emitting elements; and
   multiple optical shield layers each provided at one of a first side face of a first one of said transparent plates and a second side face of a second one of said transparent plates opposing the first side face of said first transparent plate,
   said transparent resin layer being further provided between said each of said optical shield layers and the other of said first side face of said first transparent plate and said second side face of said second transparent plate, a top surface of said transparent resin layer being exposed from said transparent plates.

2. The semiconductor light-emitting device as set forth in claim 1, wherein cavities are provided between said light-emitting elements on said support body.

3. The semiconductor light-emitting device as set forth in claim 2, further comprising optical shield resin members filled in said cavities.

4. The semiconductor light-emitting device as set forth in claim 2, wherein a height of said cavities is larger than a height of said light-emitting elements.

5. The semiconductor light-emitting device as set forth in claim 4, wherein the height of said cavities is not smaller than a height of a lower surface of said transparent plates with respect to said support body.

6. The semiconductor light-emitting device as set forth in claim 1, wherein the top surface of said transparent resin layer is flattened, and the top surface of said transparent resin layer is the same as a height of a top surface of said transparent plates.

7. The semiconductor light-emitting device as set forth in claim 1, wherein phosphor particles are included in said transparent resin layer.

8. The semiconductor light-emitting device as set forth in claim 1, wherein phosphor particles are included in said transparent plates.

9. The semiconductor light-emitting device as set forth in claim 1, wherein each of said light-emitting elements comprises:
   a first semiconductor layer of a first conductivity type;
   a second semiconductor layer of a second conductivity type opposite to said first conductivity type; and
   an active semiconductor layer sandwiched by said first and second semiconductor layers,
   wherein said support body comprises:
   a support substrate;
   a first wiring layer provided on said support substrate, said first wiring layer being electrically connected to the second semiconductor layer of one of said light-emitting elements;
   an insulating layer provided on said first wiring layer; and
   a second wiring layer provided on said insulating layer, said second wiring layer being electrically connected to the first semiconductor layer of one of said light-emitting elements.

* * * * *